(12) United States Patent  (10) Patent No.: US 8,450,813 B2
Luo et al.  (45) Date of Patent: May 28, 2013

(54) FIN TRANSISTOR STRUCTURE AND METHOD OF FABRICATING THE SAME

(75) Inventors: Zhijiong Luo, Poughkeepsie, NY (US); Haizhou Yin, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 360 days.

(21) Appl. No.: 12/937,493

(22) PCT Filed: Jun. 25, 2010

(86) PCT No.: PCT/CN2010/074512
§ 371 (c)(1), (2), (4) Date: Oct. 12, 2010

(87) PCT Pub. No.: WO2011/072520
PCT Pub. Date: Jun. 23, 2011

(65) Prior Publication Data
US 2011/0298050 A1  Dec. 8, 2011

(30) Foreign Application Priority Data

Dec. 16, 2009  (CN) .......................... 2009 1 0242768

(51) Int. Cl.
*H01L 27/088* (2006.01)
*H01L 21/02* (2006.01)
*H01L 29/78* (2006.01)
*H01L 21/336* (2006.01)
*H01L 21/3205* (2006.01)
*H01L 21/4763* (2006.01)
*H01L 21/31* (2006.01)
*H01L 21/469* (2006.01)

(52) U.S. Cl.
USPC ........... 257/401; 257/410; 257/411; 257/412; 257/E29.022; 257/E29.024; 257/E29.082; 257/E29.09; 257/E29.104; 257/E29.154; 257/E29.16; 257/E29.162; 257/E29.264; 257/E21.085; 257/E21.197; 257/E21.204; 257/E21.207; 438/283; 438/285; 438/287; 438/590; 438/591; 438/595; 438/712; 438/779; 438/787; 438/791

(58) Field of Classification Search
None
See application file for complete search history.

(56) References Cited

U.S. PATENT DOCUMENTS 6,858,478 B2 * 2/2005 Chau et al. .................... 438/149
6,921,700 B2 * 7/2005 Orlowski et al. ............. 438/283

(Continued)

FOREIGN PATENT DOCUMENTS

CN  1534745 A  10/2004
CN  1542965 A  11/2004

(Continued)

OTHER PUBLICATIONS

Park et al. Body-tied triple-gate NMOSFET fabrication using bulk Si wafer. 2005. Solid-State Electronics. vol. 49, Iss. 3, pp. 377-383.*
International Search Report and Written Opinion dated Jun. 25, 2010, in related Chinese Patent Application No. PCT/CN2010/074512 (7 pages).
English abstract of U.S. Patent 7,795,682 (Kaneko) issued Sep. 14, 2010, for corresponding JP-2007-207837 (1 page).

(Continued)

*Primary Examiner* — Hoang-Quan Ho
(74) *Attorney, Agent, or Firm* — Osha Liang LLP

(57) ABSTRACT

There is provided a fin transistor structure and a method of fabricating the same. The fin transistor structure comprises a fin formed on a semiconductor substrate, wherein a bulk semiconductor material is formed between a portion of the fin serving as the channel region of the transistor structure and the substrate, and an insulation material is formed between remaining portions of the fin and the substrate. Thereby, it is possible to reduce the current leakage while maintaining the advantages of body-tied structures.

20 Claims, 16 Drawing Sheets

(a)

(b)

(c)

U.S. PATENT DOCUMENTS

| | | | |
|---|---|---|---|
| 7,112,832 B2* | 9/2006 | Orlowski et al. | 257/287 |
| 7,514,325 B2* | 4/2009 | Kim et al. | 438/279 |
| 7,655,989 B2* | 2/2010 | Zhu et al. | 257/401 |
| 7,795,682 B2 | 9/2010 | Kaneko et al. | |
| 7,879,660 B2* | 2/2011 | Booth et al. | 438/157 |
| 7,989,855 B2* | 8/2011 | Narihiro | 257/288 |
| 8,048,723 B2* | 11/2011 | Chang et al. | 438/135 |
| 8,106,459 B2* | 1/2012 | Chang et al. | 257/353 |
| 8,207,027 B2* | 6/2012 | Zhu et al. | 438/176 |
| 8,263,462 B2* | 9/2012 | Hung et al. | 438/286 |
| 8,273,626 B2* | 9/2012 | Hareland et al. | 438/283 |
| 2004/0198003 A1* | 10/2004 | Yeo et al. | 438/284 |
| 2005/0124099 A1 | 6/2005 | Beintner et al. | |
| 2006/0172497 A1* | 8/2006 | Hareland et al. | 438/286 |
| 2007/0045748 A1* | 3/2007 | Booth et al. | 257/369 |
| 2007/0190708 A1 | 8/2007 | Kaneko et al. | |
| 2008/0048265 A1* | 2/2008 | Booth et al. | 257/350 |
| 2008/0050866 A1* | 2/2008 | Booth et al. | 438/157 |
| 2008/0194065 A1* | 8/2008 | Lee et al. | 438/151 |
| 2009/0061572 A1* | 3/2009 | Hareland et al. | 438/157 |
| 2009/0278196 A1* | 11/2009 | Chang et al. | 257/328 |
| 2010/0041198 A1* | 2/2010 | Zhu et al. | 438/283 |
| 2010/0144121 A1* | 6/2010 | Chang et al. | 438/478 |
| 2010/0163971 A1* | 7/2010 | Hung et al. | 257/327 |
| 2011/0260257 A1* | 10/2011 | Jagannathan et al. | 257/369 |
| 2011/0316080 A1* | 12/2011 | Luo et al. | 257/347 |

FOREIGN PATENT DOCUMENTS

| | | |
|---|---|---|
| CN | 1645577 A | 7/2005 |
| JP | 2007/207837 A | 8/2007 |

OTHER PUBLICATIONS

English abstract of U.S. Patent Application No. 2005/0124099 (Beintner) published Jun. 9, 2005, for corresponding CN-1645577 (1 page).

Office Action dated Jan. 11, 2012, issued by the China Patent Office in related Chinese Patent Application No. CN 2009-10242768.9, with partial English Summary (8 pages).

Espacenet English Abstract for CN-1542965 filed Nov. 3, 2004 (1 page).

Espacenet English Abstract for CN-1534745 filed Oct. 6, 2004 (1 page).

Park, Tai-su, et al., "Body-tied triple-gate NMOSFET fabrication using bulk Si wafer"; Solid-State Electronics 49 (2005); pp. 377-383. [NOTE: This article was previously cited from an International Search Report and Written Opinion dated Jun. 25, 2010, in the IDS filed with the USPTO on Nov. 17, 2011 and is not being resubmitted herein.).

T. Park et al.; "Body-tied triple-gate NMOSFET fabrication using bulk Si wafer"; Solid-State Electronics; pp. 377-383; Mar. 2005 (7 pages).

K. Okano et al.; "Process Integration Technology and Device Characteristics of CMOS FinFET on Bulk Silicon Substrate with sub-10 nm Fin Width and 20 nm Gate Length"; SoC Research & Development Center and Process & Manufacturing Engineering Center, Semiconductor Company, Toshiba Corporation; 2005 (4 pages).

* cited by examiner (a)

(b)

(a)

(b)

(a)

(b)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(d)

FIN TRANSISTOR STRUCTURE AND METHOD OF FABRICATING THE SAME

FIELD OF INVENTION

The present invention generally relates to the semiconductor device field, and more particularly, to a fin transistor structure and a method of fabricating the same.

DESCRIPTION OF PRIOR ART

Fin transistor devices such as FinFETs are being on focus because of their good cut-off characteristics, excellent scalability, and compatibility with the conventional manufacturing processes. So far, conventional FinFETs are mainly categorized into two types: FinFETs formed on a Silicon On Insulator (SOI) substrate, and FinFETs formed on a bulk Si substrate (bulk-FinFET). The bulk-FinFET has many advantages over the FinFET on SOI substrate, such as low cost, low body effect, low back-biased effect, and high heat transfer.

Document 1 (Tai-su Park el al., "Body-tied triple-gate NMOSFET fabrication using bulk Si wafer", Solid-state Electronics 49 (2005), 377-383) discloses a body-tied triple-gate NMOSFET fabricated by using a bulk Si wafer. FIG. 1 of this document illustrates a perspective view of this FET, and FIG. 2 shows the method of fabricating the FET in detail. As shown in FIGS. 1 and 2(f), a gate electrode of poly-silicon is formed across a fin which functions as the channel of the semiconductor device is formed. However, as clearly shown in FIG. 2(f), the channel has its bottom portion surrounded by SiN and $SiO_2$. As a result, the gate electrode cannot effectively control this portion. Thus, even in the off state, a current path may be formed between source and drain regions through the bottom portion of the channel, resulting in current leakage.

Document 2 (K. Okano el al., "Process Integration Technology and Device Characteristics of CMOS FinFET on Bulk Silicon Substrate with sub-10 nm Fin Width and 20 nm Gate Length", IEDM 2005) discusses the above problem in more detail. Specifically, referring to FIG. 4, leakage current densities are shown for different portions of the fin. It can be seen that the leakage current density at the bottom of the channel is hundreds or even thousands of times greater than that at the channel region.

To solve the problem of current leakage, a punch through stopper (PTS) structure may be introduced at the bottom of the channel so as to suppress the leakage current, as described in Document 2. In order to form such PTS structure at the bottom of the channel, high-energy ion implantation is often required. However, this will cause a broad distribution of the implanted dopant, and also high density of dopants in the channel region (referring to FIG. 5 of Document 2). Thus, such a structure is accompanied by large junction leakage and large junction capacitance.

Therefore, there is a need for a novel structure and a method for fabricating fin transistors, whereby it is possible to effectively reduce the leakage current at the bottom of the channel while maintaining the advantages of bulk-FinFETs such as low cost and high heat transfer, without causing high junction leakage and high junction capacitance.

SUMMARY OF THE INVENTION

In view of the above problems, it is an object of the present invention to provide a fin transistor structure and a method of fabricating the same, whereby it is possible to reduce the current leakage while maintaining advantages of body-tied structures.

According to an aspect of the present invention, there is provided a fin transistor structure, comprising a fin formed on a semiconductor substrate, wherein a bulk semiconductor material is formed between a portion of the fin serving as the channel region of the transistor structure and the substrate, and an insulation material is formed between remaining portions of the fin and the substrate.

Preferably, the portion serving as the channel region is located beneath a gate region of the fin transistor structure.

Preferably, the bulk semiconductor material may comprise one of Ge, SiGe, SiC, InGaAs, and the insulation material may comprise $SiO_2$ or SiN.

Preferably, the gate region comprises a gate electrode, and a gate dielectric layer is formed beneath the gate electrode to partially cover the surfaces of the fin. More preferably, the gate dielectric layer may comprise $SiO_2$, SiON, or high k materials, and the gate electrode comprises a poly-silicon gate electrode or a metal gate electrode. More preferably, the metal gate electrode comprises TiN, TiAlN or TaN.

According to another aspect of the present invention, there is provided a method of fabricating a fin transistor structure, comprising: forming a fin on a substrate, wherein a bulk semiconductor material is interposed between a portion of the fin serving as the channel region of the transistor structure and the substrate, and an insulation material is interposed between remaining portions of the fin and the substrate; and fabricating the transistor structure based on the substrate with the fin.

Preferably, the step of forming the fin on the substrate comprises: forming a layer of the bulk semiconductor material and a layer of fin body material in this order on the substrate; patterning the layer of the bulk semiconductor material and the layer of the fin body material to a pattern corresponding to the fin to be formed; forming an etching protection layer on the pattern formed on the substrate; patterning the etching protection layer so as to keep a portion of the etching protection layer at a position corresponding to a gate region to be formed while removing the remaining portions of the etching protection layer; performing selective etching so as to remove a portion of the bulk semiconductor material beneath the layer of the fin body material exposed by the etching protection layer; filling a space due to the selective etching beneath the layer of the fin body material with the insulation material; and removing the etching protection layer.

Preferably, the bulk semiconductor material may comprise one of Ge, SiGe, SiC, InGaAs, and the fin body material may comprise Si. Preferably, the insulation material comprises $SiO_2$ or SiN, and the etching protection layer may comprise SiN.

Preferably, the step of fabricating the transistor structure based on the substrate with the fin comprises: forming a buffer layer on the substrate with the fin; forming a stopper layer on the buffer layer; forming an isolation layer on the stopper layer, and chemical physical polishing (CMP) the isolation layer until the stopper layer is exposed; removing a portion of the stopper layer at the top of the fin, and removing a portion of the isolation layer to recess the isolation layer; etching the stopper layer and some portion of the isolation layer at either side of the fin; etching a portion of the exposed buffer layer at a position corresponding to a gate region to be formed so as to expose the fin body; forming a gate dielectric layer on the exposed fin body; and forming a gate electrode at the position corresponding to the gate region to be formed.

Preferably, the buffer layer may comprise $SiO_2$, the stopper layer may comprise SiN, and the isolation layer may comprise $SiO_2$.

Preferably, the gate dielectric layer may comprise $SiO_2$, SiON, or high k materials, and the gate electrode may comprise a poly-silicon gate electrode or a metal gate electrode. More preferably, the metal gate electrode may comprise TiN, TiAlN or TaN.

In the fin transistor structure according to embodiments of the invention, the bulk material such as Ge, SiGe, SiC, or GaAs is formed between the channel region and the substrate, resulting in a body-tied structure. This ensures that the fm transistor structure of the present invention can maintain the advantages of bulk FinFETs. Further, an insulator is formed between the remaining portions of the fin and the substrate, resulting in a like SOI structure, which effectively reduces the current leakage. Since there is no punch through stopper (PTS) structure which needs heavy doping in the present invention, there should be no concern about high junction leakage and high junction capacitance due to heavy doping.

BRIEF DESCRIPTION OF THE DRAWINGS

The above and other objects, features and advantages of the present invention will be more apparent by describing embodiments thereof in detail with reference to the attached drawings, wherein:

FIG. 7 shows a fin structure according to an embodiment of the invention, wherein FIG. 7(a) is a perspective view, FIG. 7(b) is a section view taken along the line A-A', and FIG. 7(c) is a section view taken along the line B-B'; FIG. 15(d) is a section view taken along the line C-C'.

DETAILED DESCRIPTION OF PREFERRED EMBODIMENTS

Figure 1:
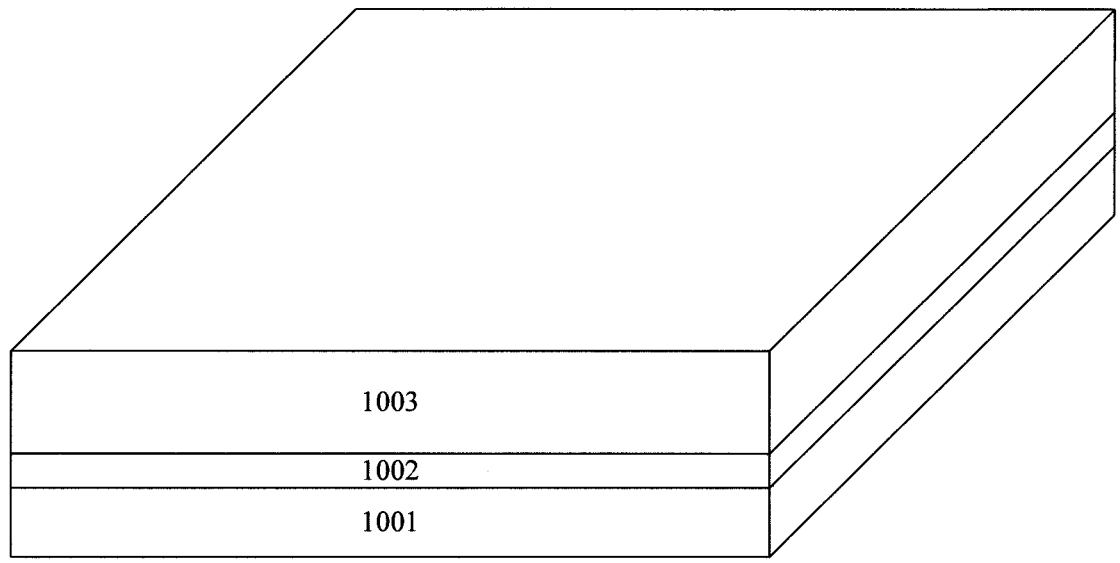
FIGS. 1-3 show intermediate structures during a fabricating process according to an embodiment of the invention respectively, wherein drawings (a) of the respective figures are perspective views, and drawings (b) of the respective figures are section views.
Figure 1:
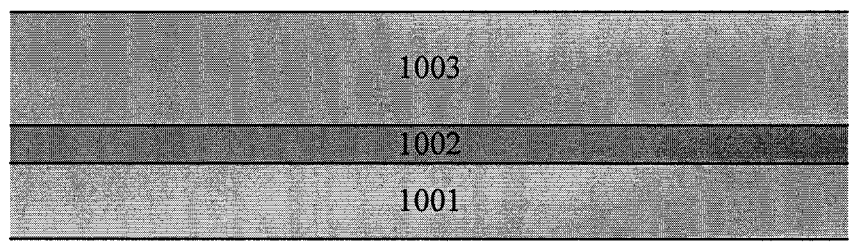

Hereinafter, the present invention is described with reference to embodiments shown in the attached drawings. However, it is to be understood that those descriptions are just provided for illustrative purpose, rather than limiting the present invention. Further, in the following, descriptions of known structures and techniques are omitted so as not to obscure the concept of the present invention.

In the drawings, various structural diagrams and sectional views of semiconductor devices according to embodiments of the present invention are shown. However, they are not drawn to scale, and some features may be enlarged while some features may be omitted for clarity. Shapes, sizes and relative locations of respective regions and layers shown in the drawings are just illustrative, and deviations therefrom may occur due to manufacture tolerances and technical limits. Those skilled in the art can also devise regions/layers of different shapes, sizes and relative locations as desired.

According to an embodiment of the present invention, there are provided a novel fin structure and a method of fabricating it. A bulk semiconductor material is formed between the channel region of the fin and a substrate, while an insulation material is formed between remaining portions of the fin and the substrate. As a result, the channel region is situated on the bulk material, causing the same advantages as bulk-FinFETs. The remaining portions are situated on the insulation material, just like FinFETs being formed on a SOI substrate, whereby it is possible to significantly reduce the current leakage.

FIG. 1 shows an intermediate structure during a fabricating process according to an embodiment of the invention, wherein FIG. 1(a) is a perspective view, and FIG. 1(b) is a section view.

As shown in FIG. 1, on a semiconductor substrate 1001, a body-tied layer 1002 and a fin body layer 1003 are formed in sequence. Here, the semiconductor substrate 1001, the body-tied layer 1002, and the fin body layer 1003 are preferably made of bulk semiconductor materials. For example, the stack of the semiconductor substrate 1001/the body-tied layer 1002/the fin body layer 1003 may be a stack of (bulk) Si/(bulk) Ge/(bulk) Si. It is to be noted that different combinations of materials are also possible. Alternatively, for example, the body-tied layer 1002 may comprise any one of SiGe, SiC, and GaAs.

Figure 2:
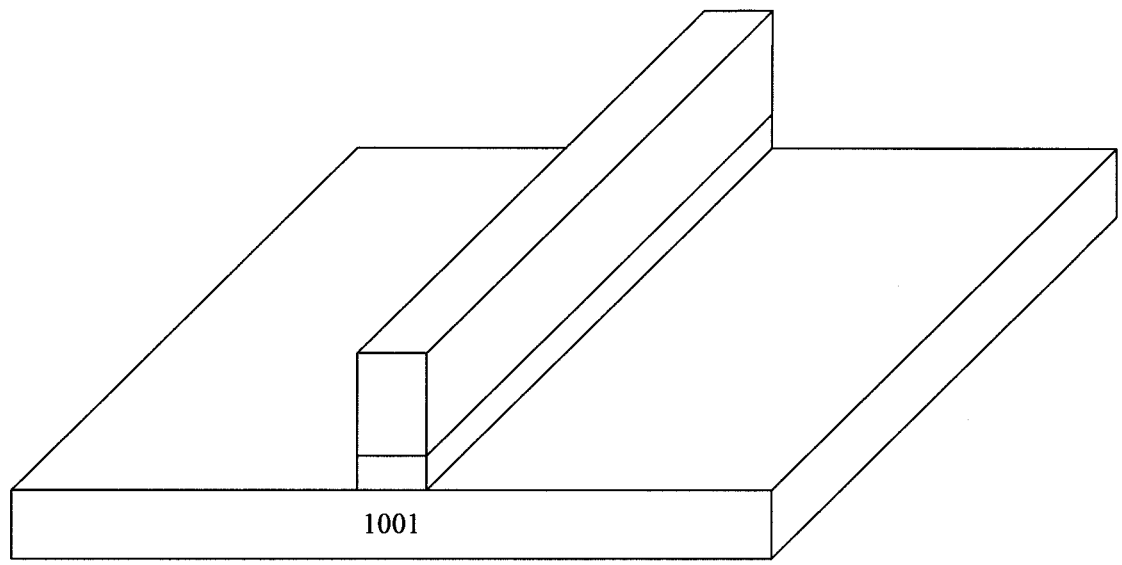
Figure 2:
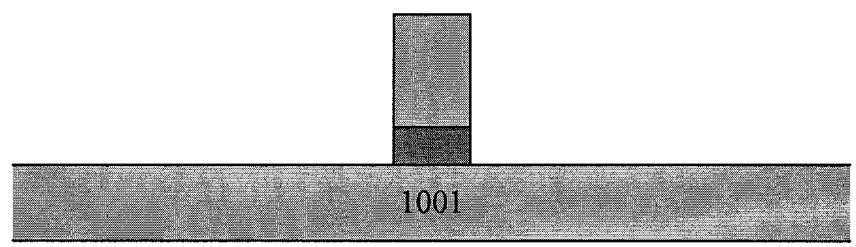

FIG. 2 shows an intermediate structure during the fabricating process according to the embodiment of the invention, wherein FIG. 2(a) is a perspective view, and FIG. 2(b) is a section view.

As shown in FIG. 2, the structure shown in FIG. 1 is patterned by means of, for example, exposure through a mask, etching, and the like, so that the body-tied layer 1002 and the fin body layer 1003 are shaped to correspond to the shape of the fin to be formed.

Figure 3:
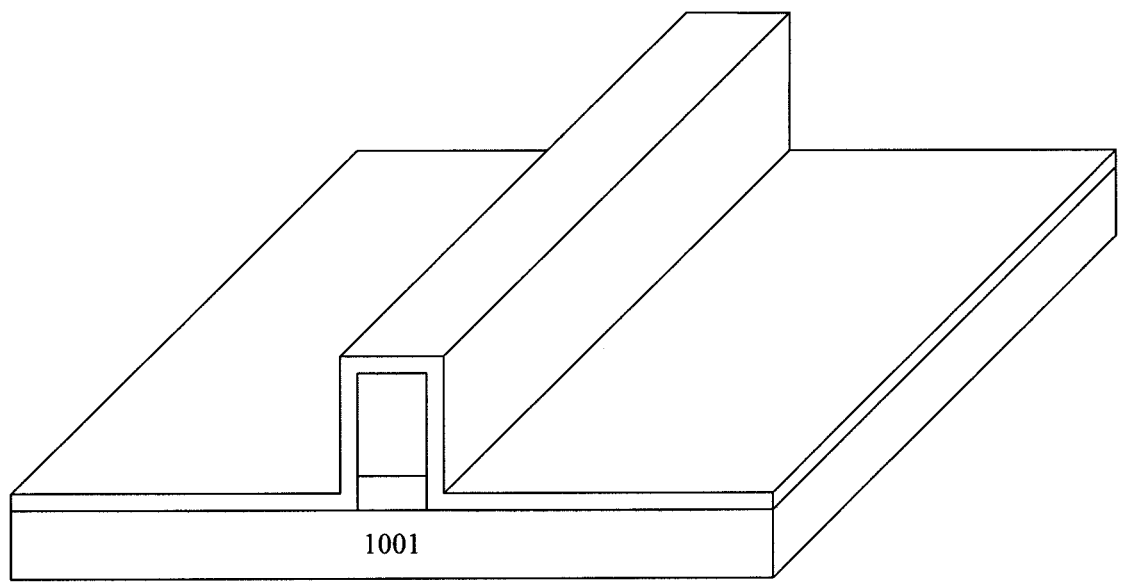
Figure 3:
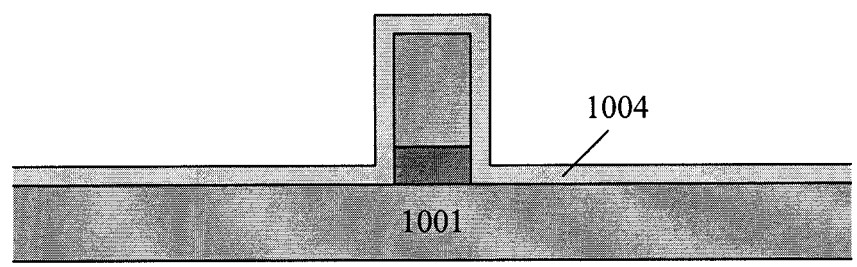

FIG. 3 shows an intermediate structure during the fabricating process according to the embodiment of the invention, wherein FIG. 3(a) is a perspective view, and FIG. 3(b) is a section view.

As shown in FIG. 3, an etching protection layer 1004 is formed on the structure shown in FIG. 2, by means of, for example, chemical vapor deposition (CVD). This etching protection layer 1004 is provided for prevent a portion of the body-tied layer 1002 beneath the channel region to be kept from being removed in etching the body-tied layer 1002. Therefore, the material for the etching protection layer 1004 should be one capable of resisting an etchant for etching the body-tied layer 1002. For example, the etching protection layer 1004 may be formed of SiN.

Figure 4:
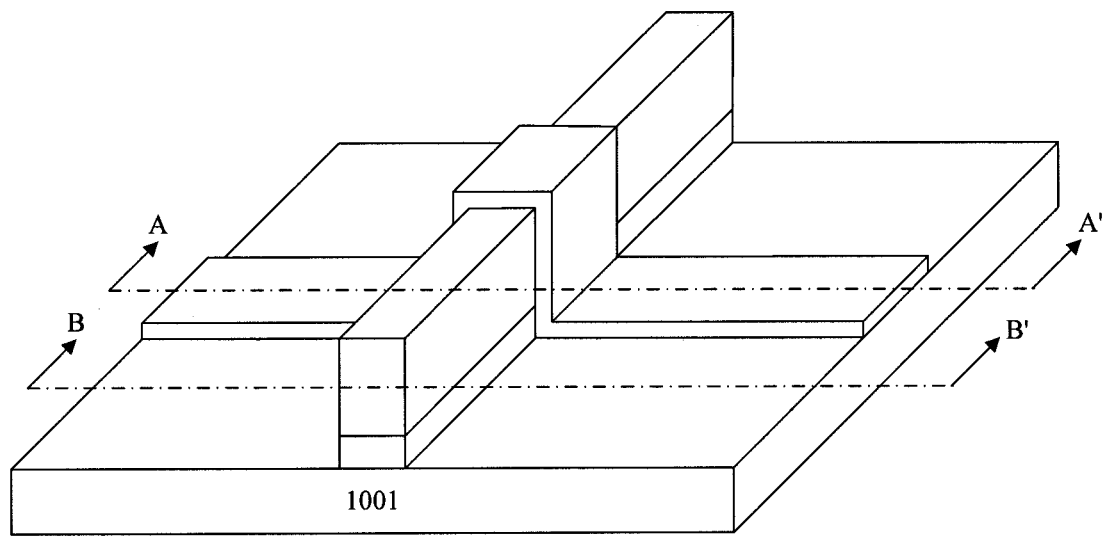
FIGS. 4-6 show intermediate structures during a fabricating process according to an embodiment of the invention respectively, wherein drawings (a) of the respective figures are perspective views, drawings (b) of the respective figures are section views taken along the line A-A', and drawings (c) of the respective figures are section views taken along the line B-B'.
Figure 4:
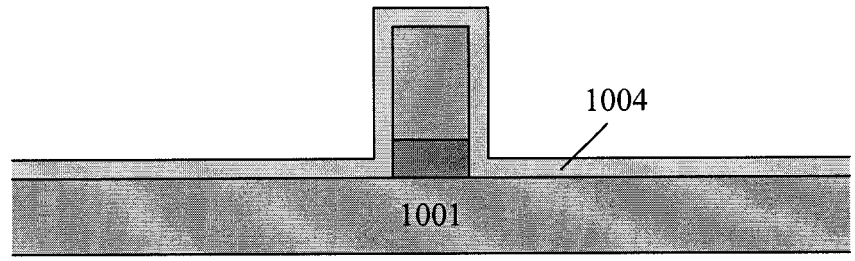
Figure 4:
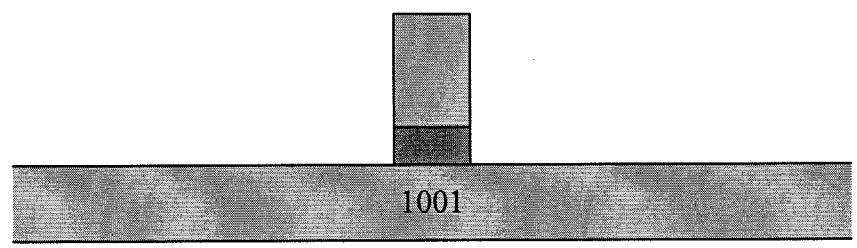

FIG. 4 shows an intermediate structure during the fabricating process according to the embodiment of the invention, wherein FIG. 4(a) is a perspective view, FIG. 4(b) is a section view taken along the line A-A' of FIG. 4(a), and FIG. 4(c) is a section view taken along the line B-B' of FIG. 4(a).

As shown in FIG. 4, the etching protection layer 1004 shown in FIG. 3 is patterned (for example, by means of photolithography) to keep a portion of this layer at a position corresponding to a gate region to be formed, so as to protect the portion of the body-tied layer 1002 beneath the channel region.

Figure 5:
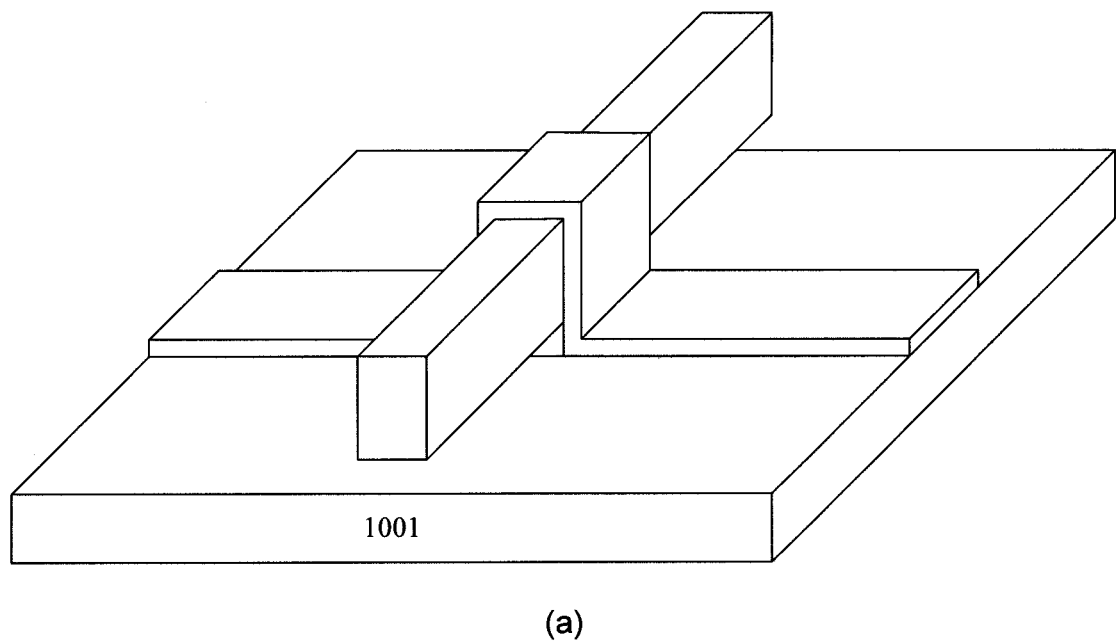
Figure 5:
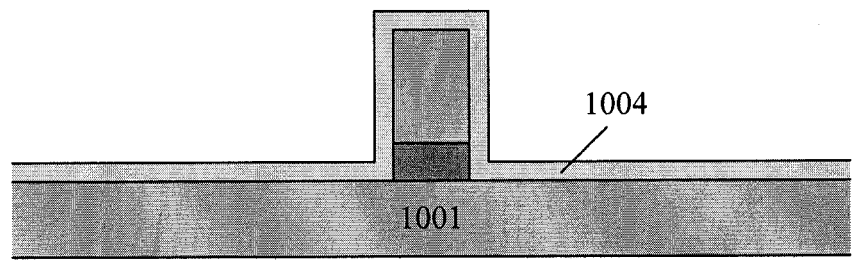
Figure 5:
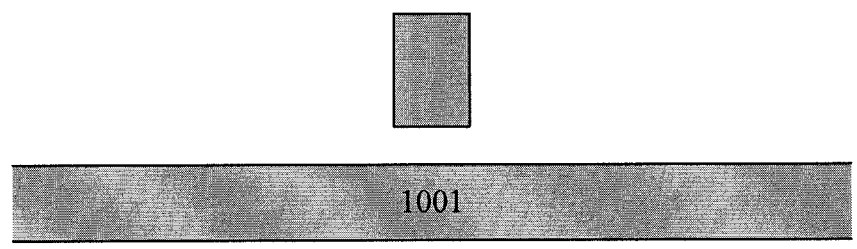

FIG. 5 shows an intermediate structure during the fabricating process according to the embodiment of the invention, wherein FIG. 5(a) is a perspective view, FIG. 5(b) is a section view taken along the line A-A', and FIG. 5(c) is a section view taken along the line B-B' (for clarity, here lines A-A' and B-B' are omitted, positions thereof are same as those shown in FIG. 4; the same is true for the following drawings).

As shown in FIG. 5, the structure shown in FIG. 4 is selectively etched. Specifically, an etchant, which has etching selectivity between the body-tied layer 1002 and the fin body layer 1003, is selected. More specifically, the etchant may etch the body-tied layer 1002 away, but has no impact, or very small impact which can be omitted, on the fin body layer 1003. Due to the etching protection layer 1004, the portion of the body-tied layer 1002 beneath the channel region is kept (referring to FIG. 5(b)), while the remaining portions of the body-tied layer 1002 are removed (referring to FIG. 5(c)).

Figure 6:
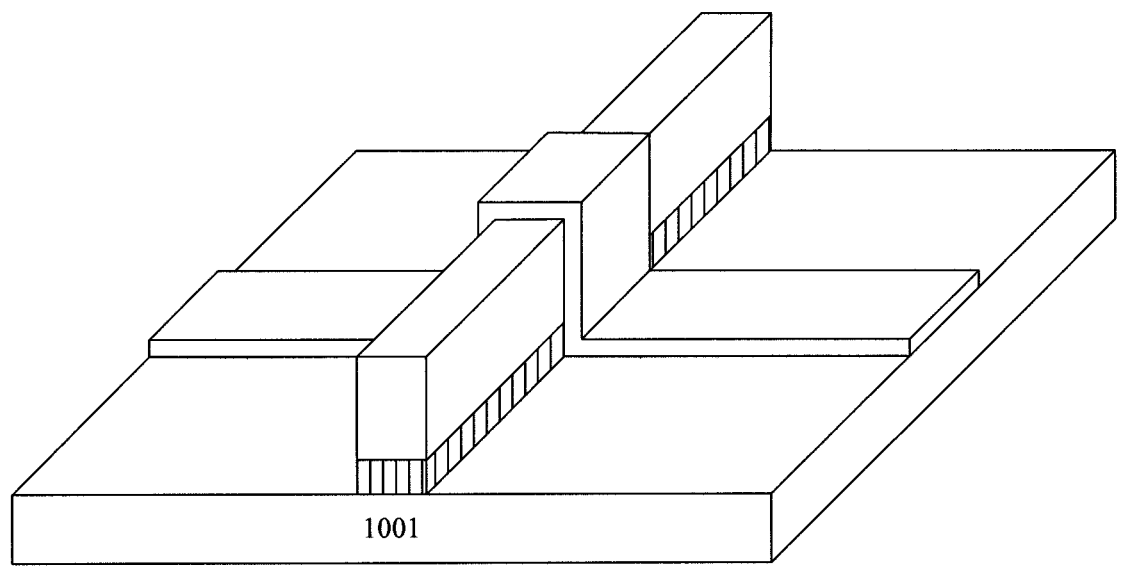
Figure 6:
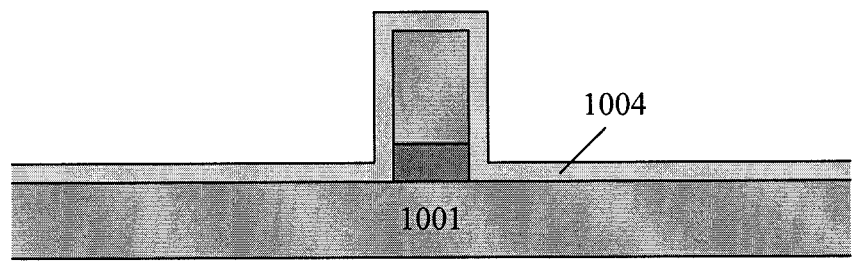
Figure 6:
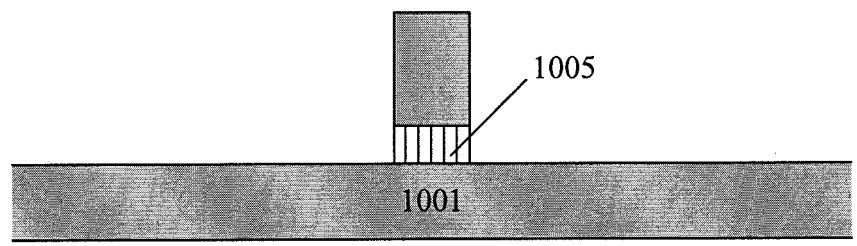

FIG. 6 shows an intermediate structure during the fabricating process according to the embodiment of the invention, wherein FIG. 6(a) is a perspective view, FIG. 6(b) is a section view taken along the line A-A', and FIG. 6(c) is a section view taken along the line B-B'.

As shown in FIG. 6, the space beneath the fin body layer 1003 due to the selective etching as shown in FIG. 5 is filled with an insulation material 1005. The insulation material may, for example, comprise $SiO_2$ or SiN. For example, the filling may be to carried out by depositing the insulation material on the structure shown in FIG. 5 and then etching back the deposited insulation material by means of reaction ion etching (RIE).

Figure 7:
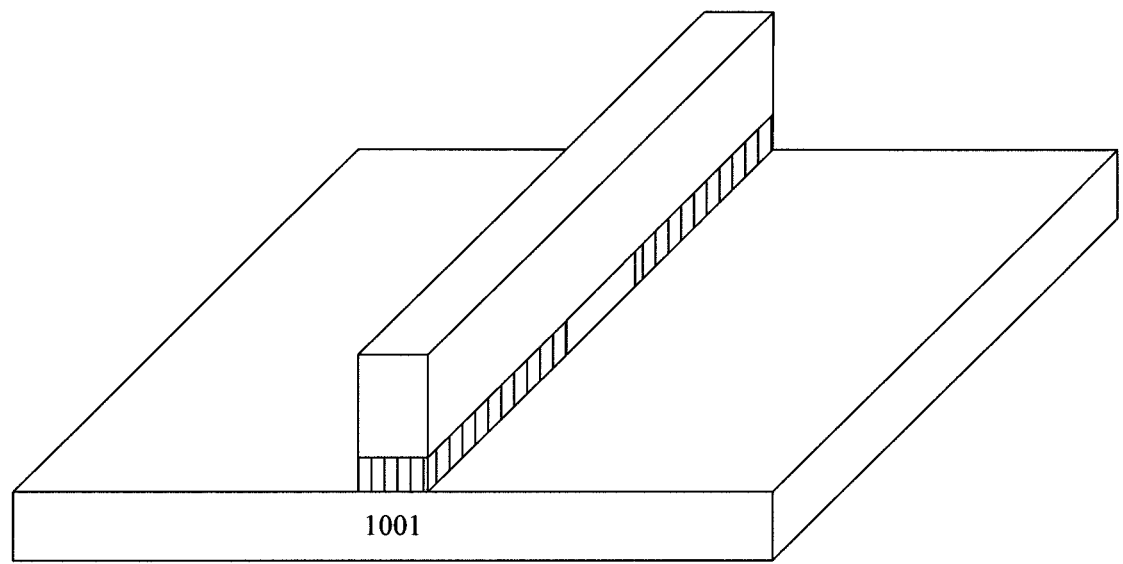
Figure 7:
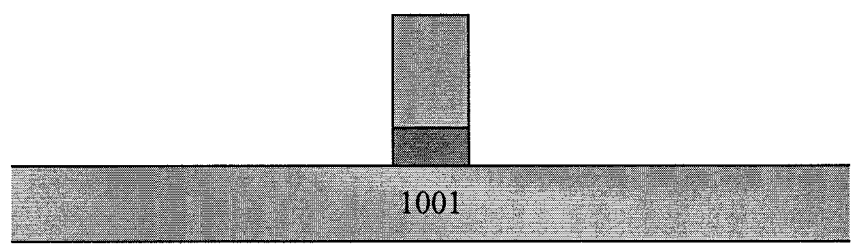
Figure 7:
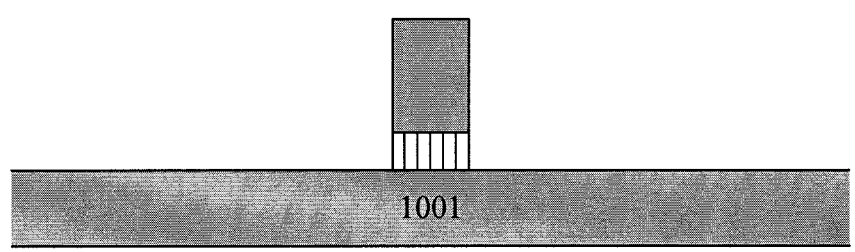

FIG. 7 shows a fin structure according to an embodiment of the invention, wherein FIG. 7(a) is a perspective view, FIG. 7(b) is a section view taken along the line A-A', and FIG. 7(c) is a section view taken along the line B-B'.

As shown in FIG. 7, the remaining etching protection layer 1004 is removed from the structure of FIG. 6, for example, by means of selective etching to provide the fin structure of the invention. In this fin structure, at the channel region, the body-tied layer 1002 is formed between the fin body layer 1003 and the substrate 1001, wherein the body-tied layer 1002 may comprise the bulk semiconductor material such as Ge, SiGe, SiC, or GaAs (referring to FIG. 7(b)). That is, a body-tied structure is formed at the channel region. Further, the insulation material 1005 is formed between the remaining portions of the fin body layer 1003 and the substrate (referring to FIG. 7(c)), resulting in a like SOT structure.

One embodiment of forming the fin structure of the invention is described as above. Those skilled in the art can conceive other ways to form the fin structure.

After the fin structure is formed on the substrate as described above, a transistor structure may be formed subsequently in various ways. Hereinafter, one example of forming the transistor structure is described so that those skilled can better understand the present invention.

FIGS. 8-15 show structures at respective steps of fabricating a transistor structure based on the above fin structure according to an embodiment of the present invention respectively, wherein in respective drawings (a) is a perspective view, (b) is a section view taken along the line A-A', and (c) is a section view taken along the line B-B'.

Figure 8:
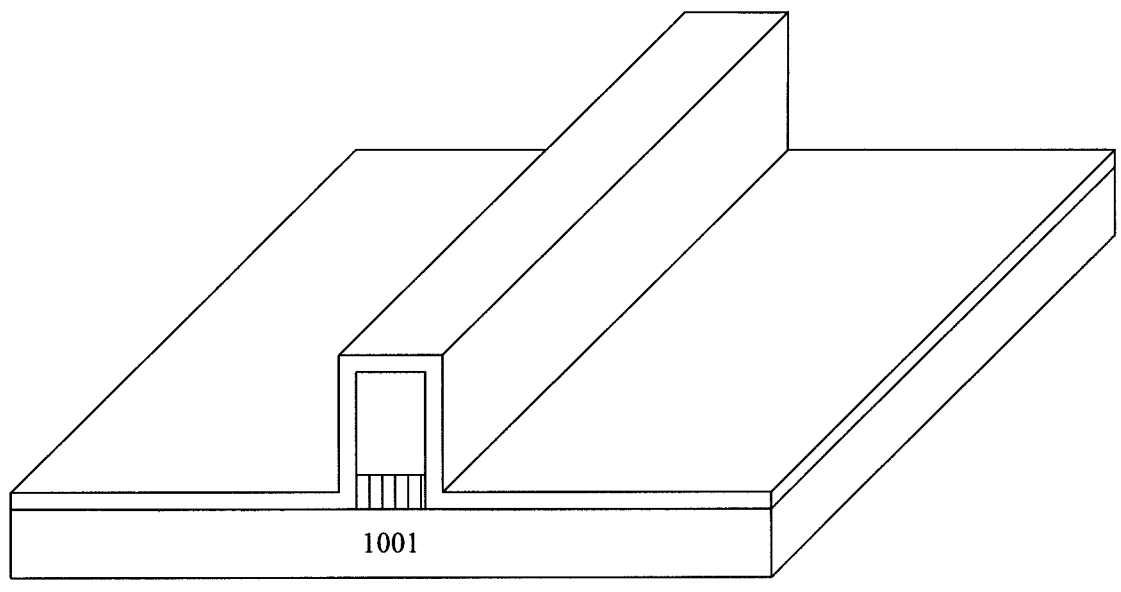
FIGS. 8-15 show structures at respective steps of fabricating a transistor structure based on the above fin structure according to an embodiment of the present invention respectively, wherein drawings (a) of the respective figures are perspective views, drawings (b) of the respective figures are sections view taken along the line A-A', drawings (c) of the respective figures are section views taken along the line B-B'.
Figure 8:
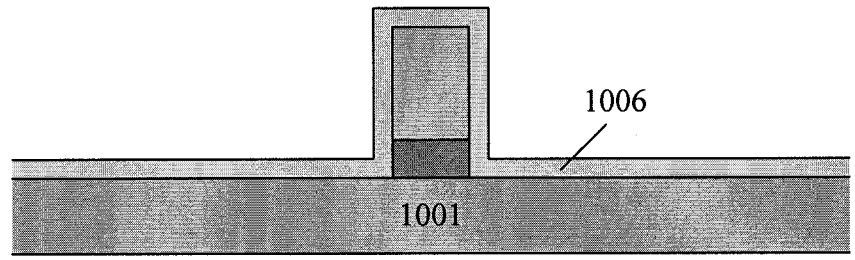
Figure 8:
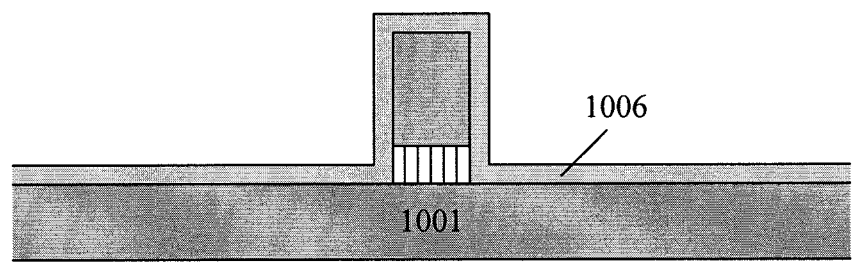
Figure 9:
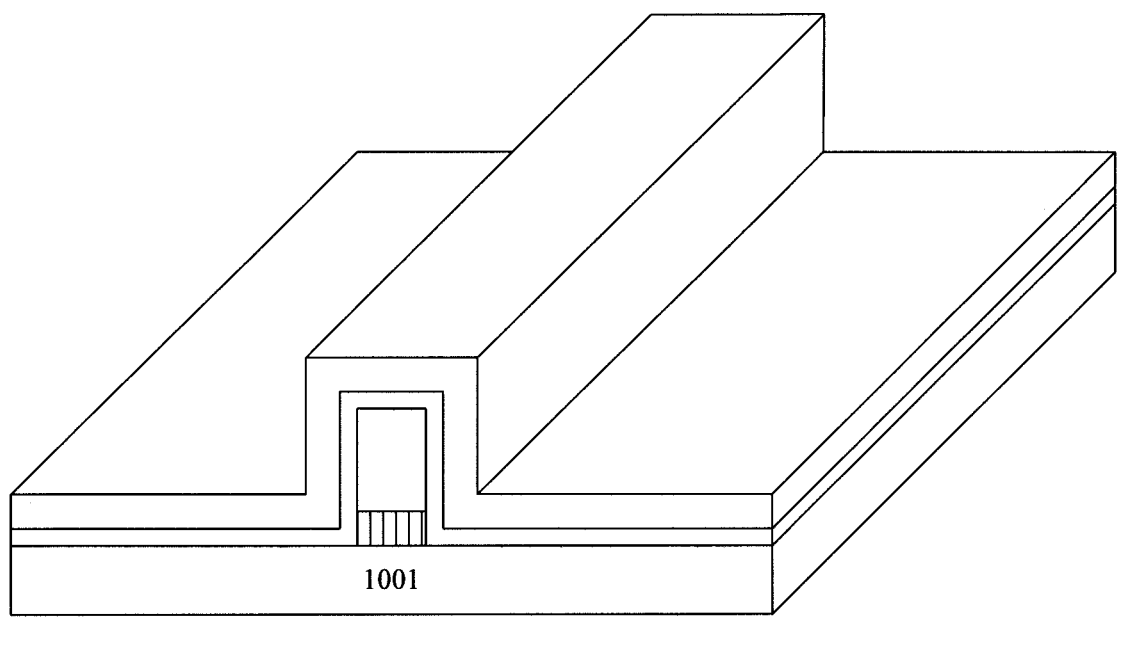
Figure 9:
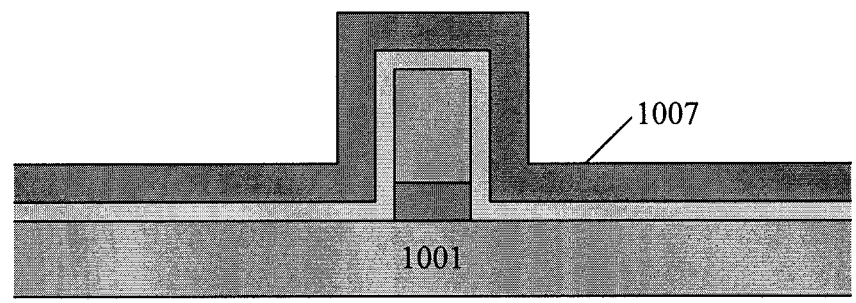
Figure 9:
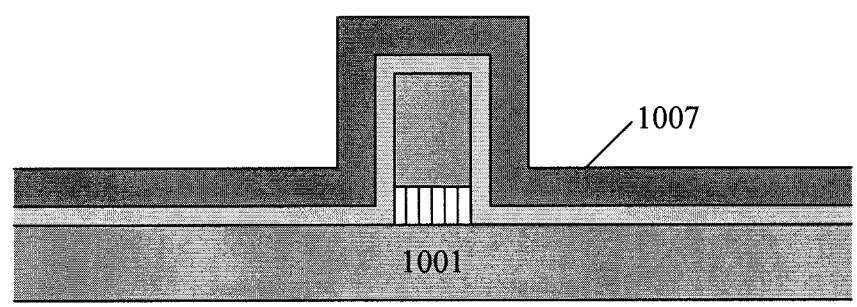
Figure 10:
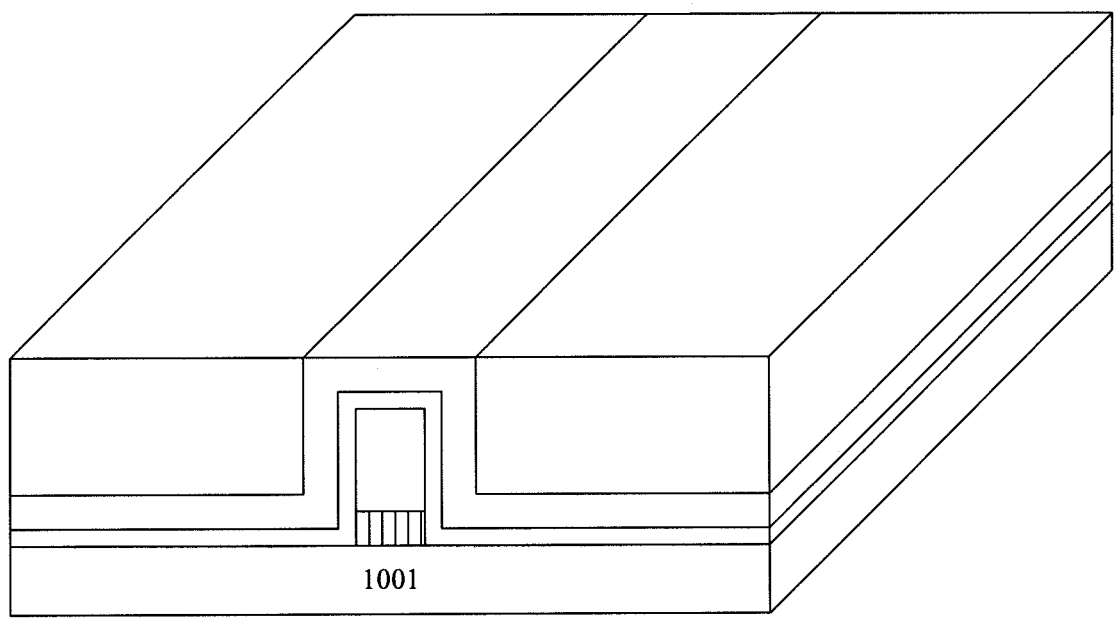
Figure 10:
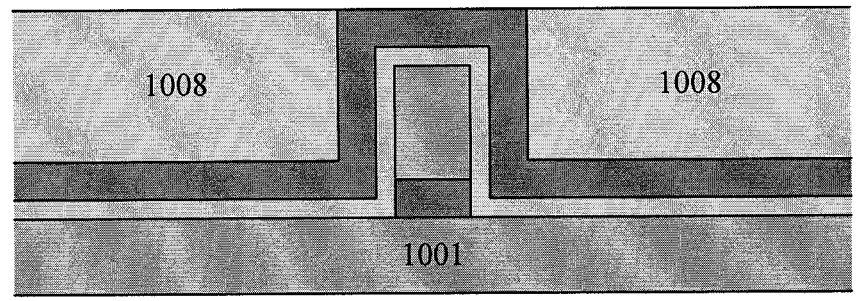
Figure 10:
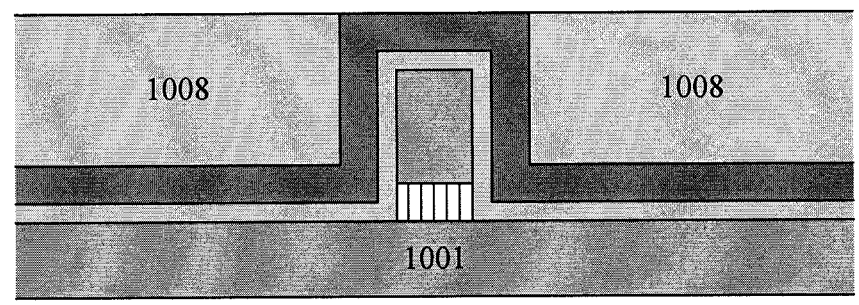

As shown in FIG. 8, a buffer layer 1006 is formed (for example, deposited) on the substrate having the fin formed thereon as shown in FIG. 7. The buffer layer 1006 may be formed of $SiO_2$, for example. Then, as shown in FIG. 9, a stopper layer 1007 is formed (for example, deposited) on the buffer layer 1006. The stopper layer 1007 may be formed of SiN, for example. Next, as shown in FIG. 10, on the resulting structure, an isolation layer 1008 is deposited. The isolation layer 1008 may be formed of $SiO_2$, for example. Preferably, chemical mechanical polishing (CMP) is performed on the deposited isolation layer 1008 until the stopper layer 1007 is exposed.

Figure 11:
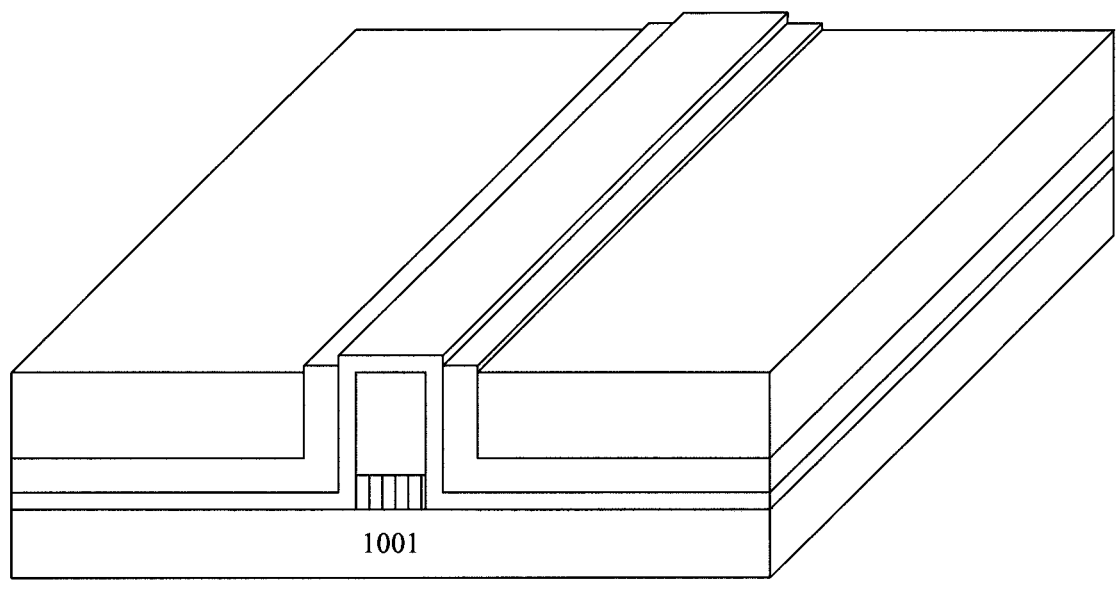
Figure 11:
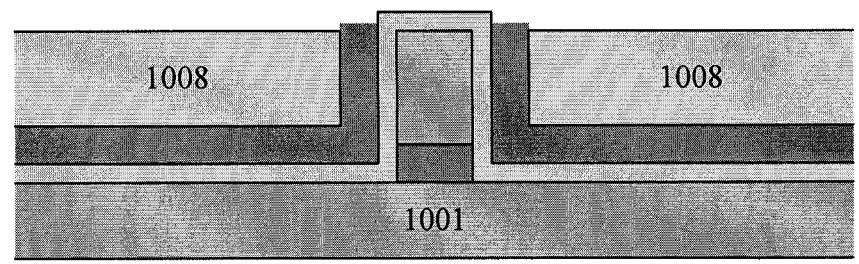
Figure 11:
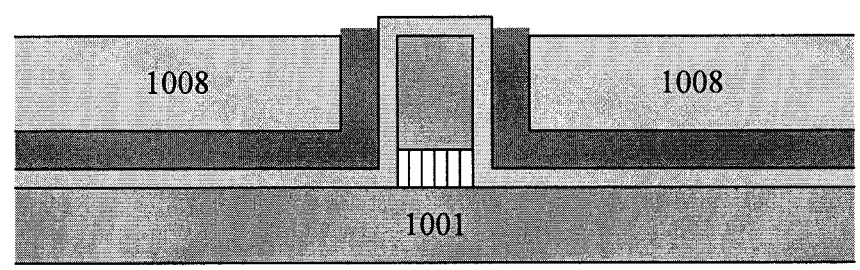
Figure 12:
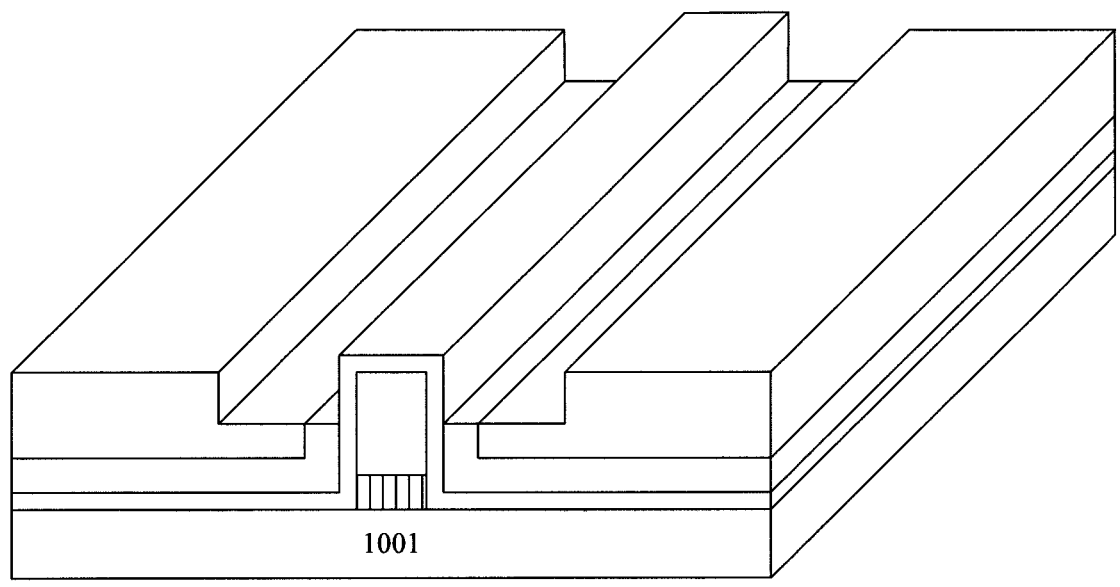
Figure 12:
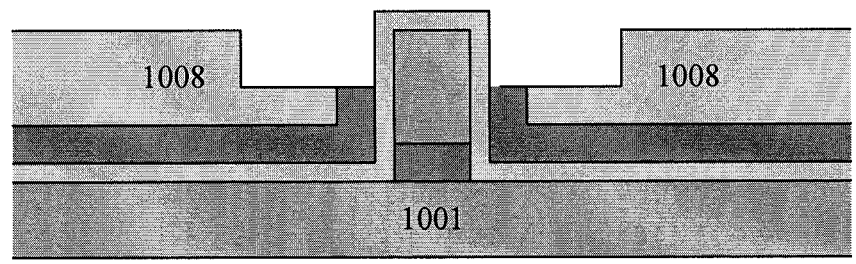
Figure 12:
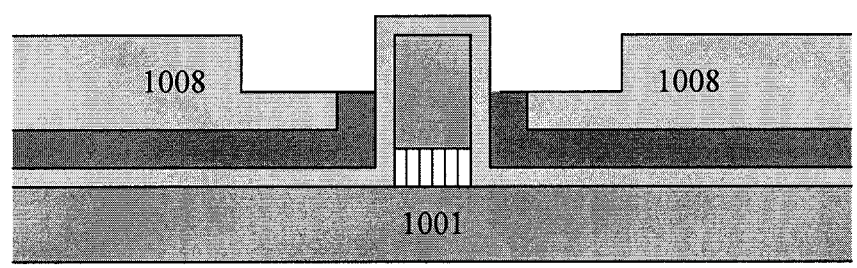
Figure 13:
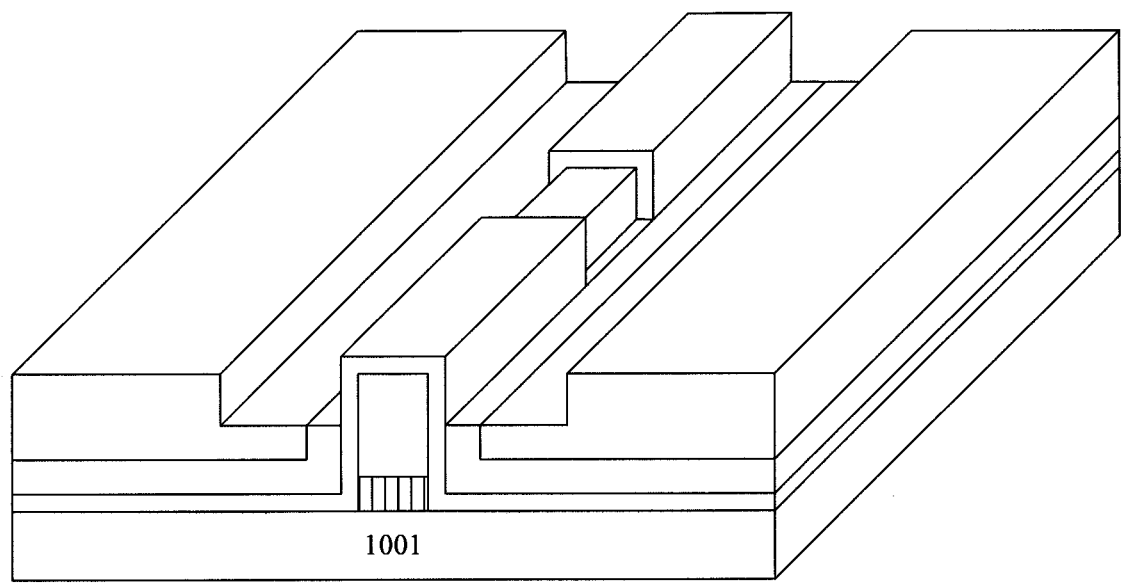
Figure 13:
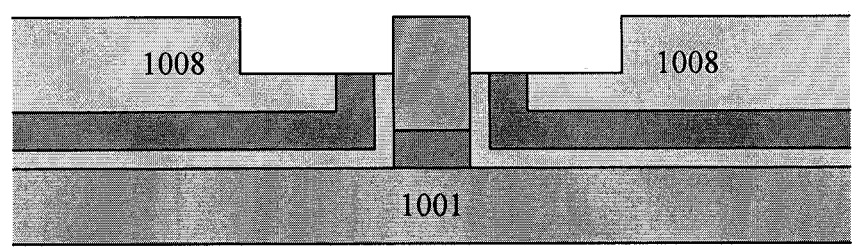
Figure 13:
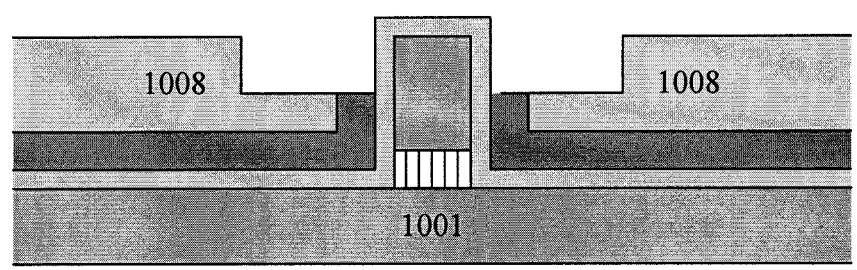

Then, as shown in FIG. 11, a portion of the stopper layer 1007 above the fin top is selectively etched away. Further, a portion of the isolation layer 1008 is removed so that the isolation layer 1008 is recessed. Next, as shown in FIG. 12, the stopper layers 1007 and some portions of the isolation layer 1008 are further etched at both sides of the fin, so as to further expose the fin structure. Then, as shown in FIG. 13, at the position corresponding to the gate region to be formed, a portion of the buffer layer 1006 is etched away, so as to expose the fin body layer 1003 (the exposed portion of the fin body layer 1003 corresponds to the channel region).

Figure 14:
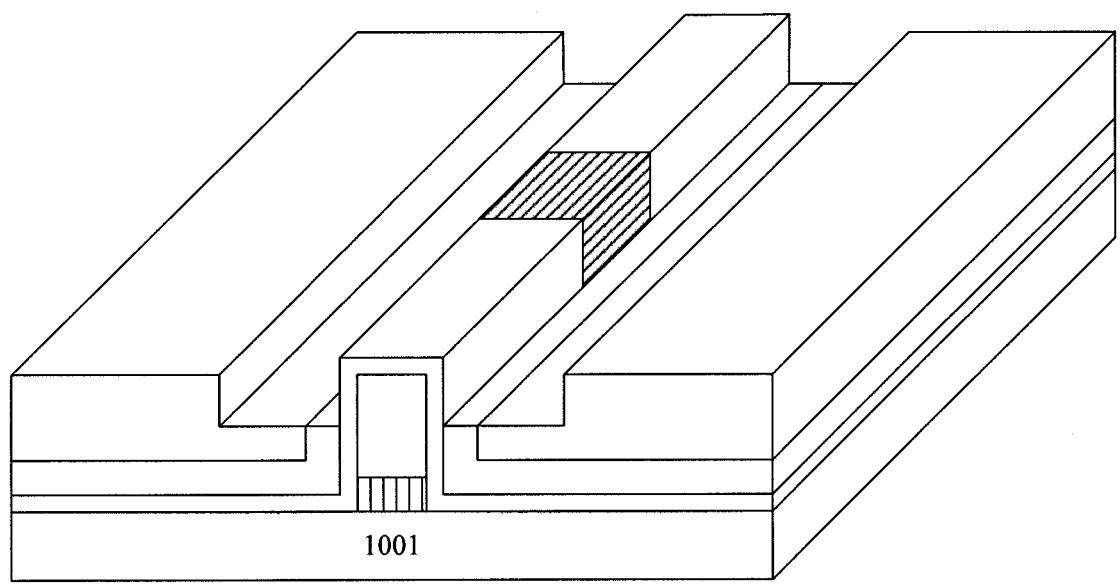
Figure 14:
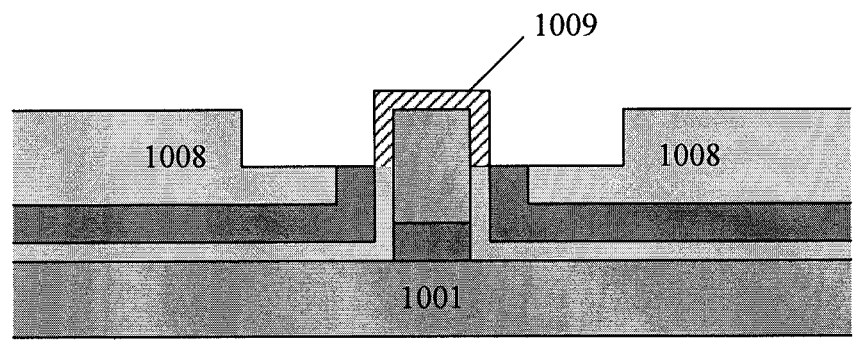
Figure 14:
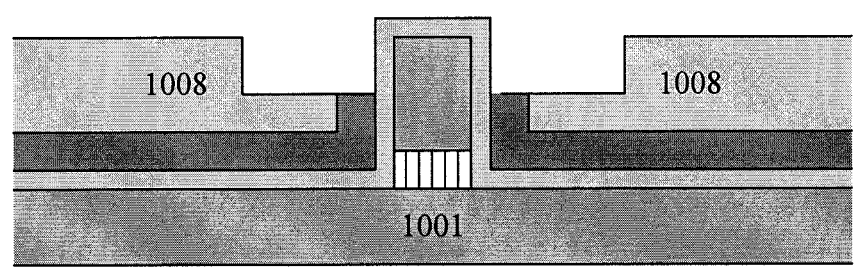
Figure 15:
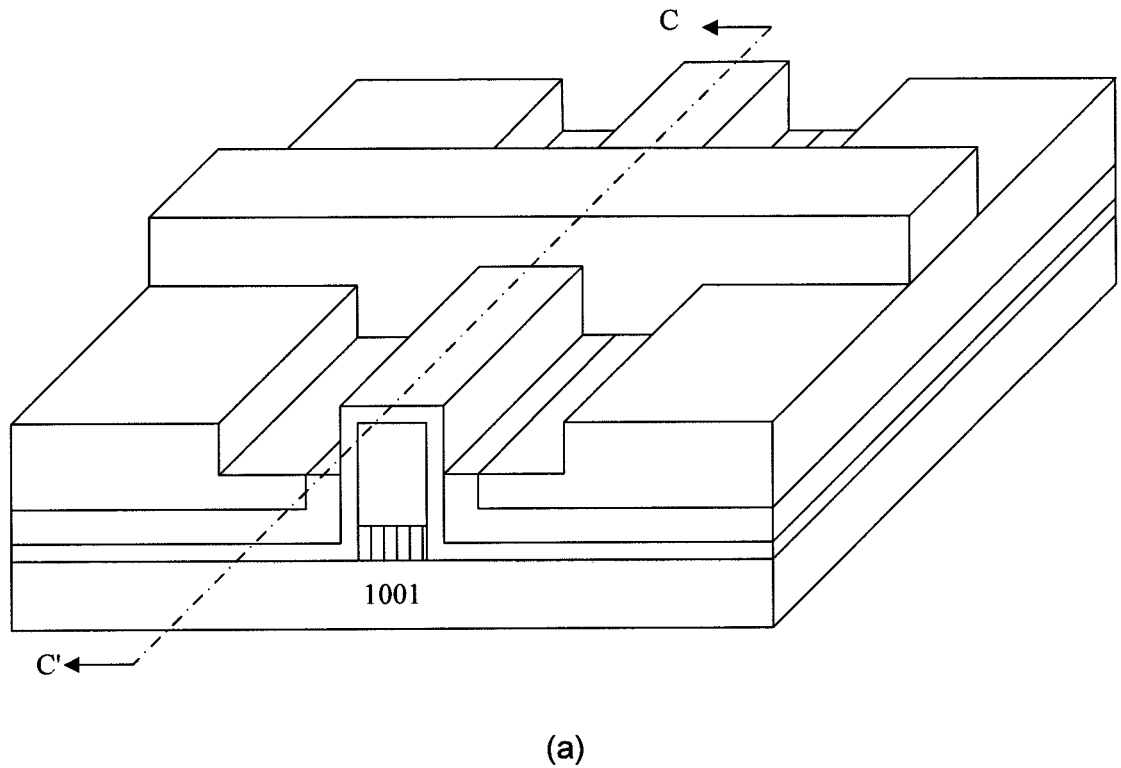
Figure 15:
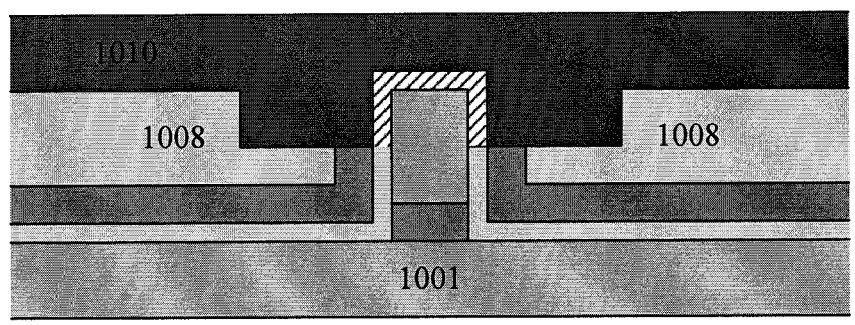
Figure 15:
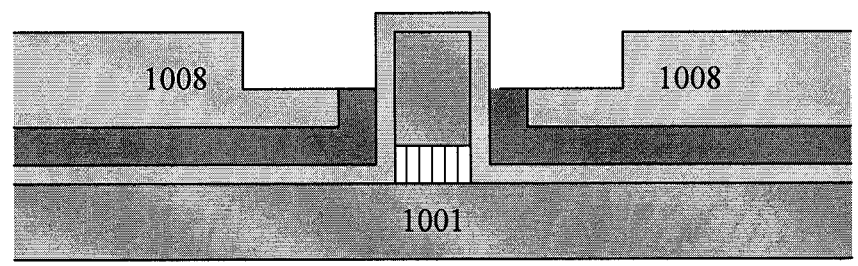
Figure 15:
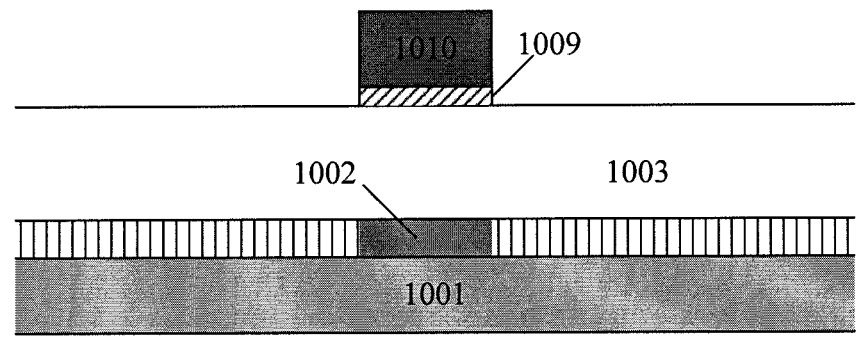

Then, as shown in FIG. 14, a gate dielectric layer 1009 is formed on the exposed portion of the fin body layer 1003. The gate dielectric layer 1009 may be formed of $SiO_2$, SiON or high k materials, for example. Next, as shown in FIG. 15, a gate electrode 1010 is formed. The gate electrode 1010 may be across the fin, and the gate dielectric layer 1009 may be formed beneath the gate electrode to partially cover the surfaces of the fin body layer 1003. The gate electrode 1010 may be a poly-silicon gate electrode, or may be a metal gate electrode such as TiN, TiAlN, and TaN.

After forming the gate electrode, the source and drain regions may be doped by means of ion implantation, so as to finally form the transistor structure according to the embodiment. The formation of such source/drain regions is not directly relevant to the subject matter of the invention, and thus is omitted here.

FIG. 15(d) is a section view taken along the line C-C' showing the resulting transistor structure. It can be seen that the body-tied layer 1002 is formed between the portion of the fin body layer 1003 beneath the gate electrode 1010 (corresponding to the channel region) and the substrate 1001. The body-tied layer 1002 is surrounded by the insulation material 1005. Therefore, it is possible to cut off the current leakage path, and thus to greatly reduce the leakage current at the bottom of the channel region.

Though the transistor structure shown in FIG. 15 is described as an example of the invention, it is to be understood by those skilled in the art that various transistor structures may be formed based on the fin structure according to the present invention, for example, double-gate FinFET, triple-gate FinFET and the like, not limited to the structure shown in FIG. 15.

In the above description, details of pattering and etching of the respective layers are not provided. It is to be understood by those skilled in the art that various means in the prior art may be utilized to form the layers and regions in desired shapes. Further, to achieve the same feature, those skilled can devise different methods than those described above.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall into the scope of the invention.

What is claimed is:
1. A fin transistor structure, comprising:
 a bulk semiconductor material layer and a fin body material layer sequentially on a semiconductor substrate,
  wherein the bulk semiconductor material layer and the fin body material layer are patterned into a shape corre- sponding to a fin, wherein the patterned fin body material layer constitutes the fin, and wherein the bulk semiconductor material layer is further patterned so that a portion thereof beneath a portion of the fin serving as a channel region of the transistor structure remains while other portions thereof are removed to create a gap, into which an insulation material is filled.

2. The fin transistor structure according to claim 1, wherein the portion serving as the channel region is located beneath a gate region of the fin transistor structure.

3. The fin transistor structure according to claim 1, wherein the bulk semiconductor material layer comprises one of Ge, SiGe, SiC, and GaAs.

4. The fin transistor structure according to claim 1, wherein the insulation material comprises $SiO_2$ or SiN.

5. The fin transistor structure according to claim 2, wherein the gate region comprises a gate electrode, and a dielectric layer is formed beneath the gate electrode to partially cover the surfaces of the fin.

6. The fin transistor structure according to claim 5, wherein the gate dielectric layer comprises $SiO_2$, SiON, or high k materials.

7. The fin transistor structure according to claim 5, wherein the gate electrode comprises a poly-silicon gate electrode or a metal gate electrode.

8. The fin transistor structure according to claim 7, wherein the metal gate electrode is formed of TiN, TiAlN or TaN.

9. A method of fabricating a fin transistor structure, comprising:

forming a bulk semiconductor material layer and a fin body material layer sequentially on a semiconductor substrate;

patterning the bulk semiconductor material layer and the fin body material layer into a shape corresponding to a fin, wherein the patterned fin body material layer constitutes the fin;

further patterning the bulk semiconductor material layer so that a portion thereof beneath a portion of the fin serving as a channel region of the transistor structure remains, while other portions thereof are removed to create a gap;

filling the gap with an insulation material; and fabricating the transistor structure based on the substrate with the fin.

10. The method according to claim 9, wherein the step of further patterning the bulk semiconductor material layer comprises:

forming an etching protection layer on the substrate with the patterned bulk semiconductor material layer and fin body material layer thereon;

patterning the etching protection layer so as to keep a portion of the etching protection layer at a position corresponding to a gate region to be formed while removing the remaining portions of the etching protection layer; and performing selective etching on the resulting substrate so as to remove portions of the bulk semiconductor material layer beneath the fin body material layer at the remaining portions.

11. The method according to claim 9, wherein the bulk semiconductor material layer comprises one of Ge, SiGe, SiC, and GaAs, and the fin body material layer comprises Si.

12. The method according to claim 9, wherein the insulation material comprises $SiO_2$ or SiN.

13. The method according to claim 10, wherein the etching protection layer comprises SiN.

14. The method according to claim 9, wherein the step of fabricating the transistor structure based on the substrate with the fin comprises:

forming a buffer layer on the substrate with the fin;

forming a stopper layer on the buffer layer;

forming an isolation layer on the stopper layer, and performing CMP on the isolation layer until the stopper layer is exposed;

removing a portion of the stopper layer at the top of the fin, and removing a portion of the isolation layer to recess the isolation layer;

etching the stopper layer at both sides of the fin and portions of the isolation layer at both sides of the stopper layer;

etching a portion of the exposed buffer layer at a position corresponding to a gate region to be formed so as to expose the fin body;

forming a gate dielectric layer on the exposed fin body; and forming a gate electrode at the position corresponding to the gate region to be formed.

15. The method according to claim 14, wherein the buffer layer is formed of $SiO_2$.

16. The method according to claim 14, wherein the stopper layer is formed of SiN.

17. The method according to claim 14, wherein the isolation layer is formed of $SiO_2$.

18. The method according to claim 14, wherein the gate dielectric layer is formed of $SiO_2$, SiON, or high k materials.

19. The method according to claim 14, wherein the gate electrode is one of a poly-silicon gate electrode and a metal gate electrode.

20. The method according to claim 19, wherein the metal gate electrode is formed of TiN, TiAlN or TaN.

* * * * *